US012690122B2

(12) United States Patent
Kwok et al.

(10) Patent No.: US 12,690,122 B2
(45) Date of Patent: Jul. 21, 2026

(54) MILLIWAVE RF DEVICE BASED ON FLEXIBLE AND DEFORMABLE MATERIALS WITH LOW DIELECTRIC CONSTANT AND DIELECTRIC LOSS

(71) Applicant: Nano and Advanced Materials Institute Limited, Hong Kong (HK)

(72) Inventors: Chi Ho Kwok, Hong Kong (HK); Wai Chung Li, Hong Kong (HK); Yan Liu, Hong Kong (HK); Kal Lee, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 194 days.

(21) Appl. No.: 18/519,094

(22) Filed: Nov. 27, 2023

(65) Prior Publication Data

US 2025/0176097 A1 May 29, 2025

(51) Int. Cl.
*H05K 1/02* (2006.01)
*H01Q 1/38* (2006.01)

(52) U.S. Cl.
CPC ............... *H05K 1/024* (2013.01); *H01Q 1/38* (2013.01)

(58) Field of Classification Search
None
See application file for complete search history.

(56) References Cited

U.S. PATENT DOCUMENTS 10,847,890 B2 11/2020 Kim et al.
2010/0279566 A1* 11/2010 Yang ........................ H01G 4/18 156/308.2
2017/0173866 A1 6/2017 Schonenberg et al.
2018/0086025 A1* 3/2018 Yoshigahara ............ C08K 3/08
2021/0054168 A1 2/2021 Hao et al.
2022/0151066 A1 5/2022 Takada et al.
2023/0143643 A1* 5/2023 Mizori ................ C08G 73/121 428/458

FOREIGN PATENT DOCUMENTS

CN 1753950 A 3/2006
CN 114790301 B 6/2023

* cited by examiner

*Primary Examiner* — Chinessa T. Golden
(74) *Attorney, Agent, or Firm* — IDEA Intellectual Limited; Sam T. Yip

(57) ABSTRACT

A low loss flexible copper clad laminate (FCCL) for millimeter wave transmission with a dielectric layer comprising an electrospun nanofiber network of cyclized polyacrylonitrile, formed between conducting copper layers. The cyclized polyacrylonitrile has improved thermal stability over its uncyclized form while maintaining a higher porosity, which further enables the infusion of a second resin of low dielectric constant and low dielectric loss to increase compatibility between the conducting copper layers and nanofibers, and the compatibility between nanofibers, which further enhances the dielectric properties and structural integrity of the FCCL. The FCCL, apart from its low dielectric constant, has performances comparable with existing ultra-low loss materials but with lower costs, and can be utilized as a passive RF component in high-frequency transmission devices including flexible antennas and transmission lines, decreasing the transmission loss due to Joule heating and signal lagging, specifically suited for various high frequency signal transmission applications.

10 Claims, 17 Drawing Sheets

| Bit rate: 10Gbps | |
|---|---|
| ΔDk | Eye Diagram |
| 0 |  |
| 1 |  |
| 2 |  |
| 3 |  |

MILLIWAVE RF DEVICE BASED ON FLEXIBLE AND DEFORMABLE MATERIALS WITH LOW DIELECTRIC CONSTANT AND DIELECTRIC LOSS

FIELD OF THE INVENTION

The present invention generally relates to millimeter wave signal transmission. More specifically, the present invention relates to a dielectric layer with electrospun nanofiber network to facilitate high frequency signal transmission.

BACKGROUND OF THE INVENTION

With millimeter wave (mmWave) radar and transmission becoming increasingly widespread, and the development of appliances which utilize mmWave transmission, including but not limited to high-capacity and high-speed communication systems, advanced driver assistance system (ADAS) of automobiles, progress in signal transmission with higher frequencies of waves is inevitable.

As such, with the high-frequency mmWave signals typically in the range of 30 GHz to 300 GHz, which corresponds to wavelengths of approximately 1-10 mm, the choice of dielectric material becomes increasingly crucial, as its electrical properties directly impact signal propagation, transmission efficiency and hence the overall performance of the communication systems.

In choosing the suitable material to be the dielectric substrate, the dielectric constants (Dk) and dielectric losses (Df) of the materials are key factors to consider. A lower Dk increases the signal transmission speed, and lowers signal delay. A lower Df on the other hand reduces signal attenuation and optimizes system efficiency.

Conventional printed circuit boards (PCBs) or wiring boards typically use epoxy or polyimide resin as the dielectric material. However, their Dk and Df are not sufficiently low, therefore their transmission speed is lowered and hence transmission losses become high, especially when the systems are used for high frequency signal transmission above 28 GHz. In addition, the thermal stability of epoxy and polyimide resins are not high enough to withstand high-frequency transmission. The two shortcomings combined causes signal delay, attenuation and component heating issues.

In response to this technical bottleneck, the industry has developed various chemical structures and methods to minimize both the dielectric constant and loss of polymer films, including poly(phenylene ether), modified polyimide (m-PI) with fluorinated substituents, and the usage of liquid crystal polymers (LCPs).

However, the above solutions in general have cost-and-performance concerns. For example, LCP is of a higher cost and may be difficult to process; and a design with both low Dk and low Df has not been achieved with m-PI. Thus, there is a need in the art for a dielectric material with desirably low Dk and Df values and good mechanical properties for high-frequency signal transmission with a reasonably low cost.

SUMMARY OF THE INVENTION

In one aspect of the present invention, a flexible copper clad laminate (FCCL) for millimeter wave transmission is provided herewith, which exhibits a low loss in comparison to other prior art structures.

The FCCL comprises at least one dielectric sheet layer and at least one copper conductor layer, wherein the dielectric layer is a nanofiber network electrospun from a first resin.

The nanofiber network comprises micropores or nanopores, which is infused with a second resin.

It is an essential feature of the present invention that the difference in the dielectric constants between the first resin and the second resin is less than 1.0.

The FCCL displays remarkable dielectric properties, with a low Dk value of no higher than 2.5, and a Df value of no higher than 0.005 during millimeter wave transmission.

The above structure could also significantly reduce the mismatch loss of the transmission line caused by fiber weave effect to less than 1%.

The first resin can be selected from a wide range of polymers including cyclized polyacrylonitrile, polyphenylene ether, m-polyimide, polytetrafluoroethylene, polyetheretherketone or polyterephthlate.

The second resin can be selected from polyethylene, polyether ether ketone, polyethylene naphthalate, polyethylene terephthalate or polyimide.

The dielectric losses of the first and second resins are both less than 0.005.

The FCCL of the present invention is also specifically designed, with the diameter of the electrospun nanofiber in the dielectric layer within the range of 300 nm to 500 nm.

In the electrospun nanofiber network, the micropores or nanopores has an average size of 900 nm to 2.5 μm; and the porosity of the nanofiber network in the dielectric layer is 75% to 90%.

The laminate of the FCCL of the present invention also has a thermal expansion coefficient of lower than 3.6 ppm/K for better signal integrity and maintenance of structural stability during millimeter wave transmission.

In another aspect of the of the present invention, a high frequency transmission device for high frequency signal comprising the low loss FCCL in the first aspect of the present invention is also provided herewith, wherein the device is a passive RF device. The passive RF device could be selected from but not limited to antenna or transmission lines.

The FCCL in the passive RF device is designed such that the diameter of the nanofiber in the dielectric layer is 300 nm to 500 nm; the size of the micropores or nanopores of the nanofiber network is 900 nm to 2.5 umm; and the porosity of the nanofiber network in the dielectric layer is 75% to 90%.

The first resin of the FCCL in the passive RF device is selected from cyclized polyacrylonitrile, polyphenylene ether, m-polyimide, polytetrafluoroethylene, polyetheretherketone or polyterephthalate; and the second resin of the FCCL in the passive RF device is selected from polyethylene, polyether ether ketone, polyethylene naphthalate, polyethylene terephthalate or polyimide, such that the difference in the dielectric constants between the first resin and the second resin is less than 1.0.

The dielectric losses of both the first resin and the second resin in the low loss FCCL in the passive RF device is less than 0.005, and the mismatch loss due to fiber weave effect is less than 1%.

BRIEF DESCRIPTION OF THE DRAWINGS

Embodiments of the invention are described in more details hereinafter with reference to the drawings, in which:

FIG. 4A shows the top view of the antenna, and FIG. 4B show the side view of the antenna structure.

FIG. 7A shows the top view of the antenna, and FIG. 7B show the side view of the antenna structure.

FIGS. 8A and 8B are plotted with data obtained from antenna with different total thicknesses of dielectric layers.

FIG. 9A shows the top view of the patch antenna with FSS, and FIG. 9B show the multi-layered integrated structure of the antenna with FSS.

DETAILED DESCRIPTION

The present invention is directed towards a low dielectric constant and low loss flexible copper clad laminate (FCCL) tailored for millimeter wave transmission. The FCCL comprises a unique nanofiber network-based dielectric layer and a copper conductor layer, providing high signal transmission efficiency, excellent flexibility, and good thermal stability. The incorporation of specific resins within the nanofiber network minimizes the fiber weave effect of the PCB, thereby reducing signal distortion and attenuation during transmission. The FCCL's exceptional properties make it an ideal material for use in high frequency transmission devices, such as antennas and transmission lines.

The low loss flexible copper clad laminate (FCCL) for millimeter wave transmission described herein is designed to meet the challenges associated with high frequency signal transmission. In one embodiment, the FCCL includes at least one dielectric sheet layer, composed of an electrospun nanofiber network formed with a first resin, particularly cyclized polyacrylonitrile. As used herein, the expression "cyclized polyacrylonitrile" relates to a polyacrylonitrile in which the nitrile groups have been at least partially converted into cyclic structures under a heat of 200° C.-300° C. In this manner, the material demonstrates enhanced properties such as increased fiber rigidity, higher electrospun fiber network porosity for infusion with adhesives, and lower polarizability.

The nanofiber network is characterized by the presence of micropores or nanopores, which can be either through pores or blind pores. A blind pore is one in which liquids or fluids cannot pass through, and a through pore is one in which liquids or fluids can pass through. These micropores or nanopores contribute to the improved dielectric performance of the FCCL.

Furthermore, in certain embodiments, the micropores or nanopores within the nanofiber network are infused with a second resin. The second resin may be selected from one or more resins including polyethylene, polyether ether ketone, polyethylene naphthalate, polyethylene terephthalate, and polyimide, which also acts as an adhesive. The infusion with this second resin helps in reducing the fiber weave effect of the PCB, and minimizing signal distortion and losses during transmission.

Figure 10:
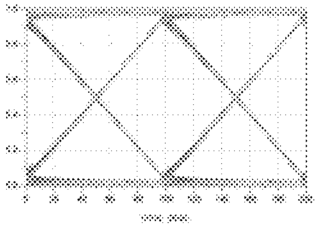
FIG. 10 shows eye diagrams showing loss arising from fiber weave effect of the PCB due to the differences in dielectric constants of the first resin and the second resin.
Figure 10:
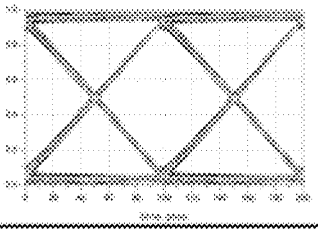
Figure 10:
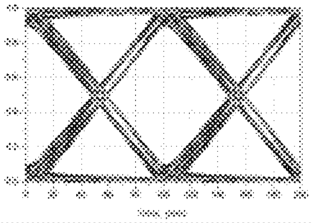
Figure 10:
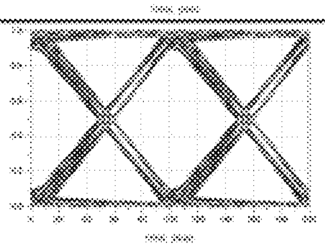

Table 1 below shows the loss arising from fiber weave effect of the PCB due to the differences in dielectric constants of the first resin and the second resin, and FIG. 10 shows their respective eye diagrams. It is observed that a loss of below 1% and a high quality eye diagram can be achieved when the difference in the dielectric constants of the first resin and the second resin is less than 1.0.

TABLE 1

| $\Delta D_k$ (Difference between the $D_k$ of first resin and second resin) | Loss (%) |
|---|---|
| 0 | 0 |
| 1 | 0.4 |
| 2 | 1.2 |
| 3 | 2.2 |

Additionally, the diameter of the nanofiber in the dielectric layer falls within a range of 300 nm to 500 nm, ensuring optimal dielectric performance and mechanical stability. The size of the micropores or nanopores in the nanofiber network may range from 900 nm to 2.5 μm, contributing to the overall low loss characteristics and improved flexibility of the FCCL.

Moreover, the porosity of the nanofiber network in the dielectric layer may range from 75% to 90%, providing the desired balance between low signal loss and mechanical flexibility for effective millimeter wave transmission, and optimizing the infusion with a second resin as an adhesive.

In one aspect, the FCCL demonstrates a low coefficient of thermal expansion, with a value lower than 3.6 ppm/K, ensuring stable performance across a wide range of operating temperatures and prevents performance deterioration and structure destabilization due to heat generated during signal transmission.

The exceptional dielectric properties of the FCCL result in minimal dielectric loss, with a value of less than 0.005, ensuring highly efficient millimeter wave transmission.

Additionally, the loss caused by fiber weave effect in the FCCL is low for millimeter wave transmission, with a value of less than 1%, ensuring minimal signal degradation during transmission.

The application of the low loss flexible copper clad laminate described herein extends to various high frequency transmission devices, including antennas and transmission lines, suitable for efficient and reliable high-frequency signal transmission.

In comparison to known liquid crystal polymer (LCP) and polytetrafluoroethylene (PTFE) ultra-low loss transmission materials for transmission (defined as materials having Dk value lower than 2.9 and Df value lower than 0.003), the flexible copper clad laminate of the present invention exhibits properties comparable with the above materials (as shown in the examples below), but at a significantly lower cost. Further, the FCCL materials offer high design flexibility for usage in flexible antennas or high-speed transmission cables, which have wide applications including radar detectors for autonomous driving cars, high-speed high-frequency data transmission lines, and aerospace and communication applications.

EXAMPLE

Table 1 below shows the properties of the FCCL, where the properties tests followed ASTM, IPC and JIS standards. In addition, the FCCL also passed reliability tests under the international standards of JIS-C5016-9.5 (on water absorption) and JIS-C5016-10.5 (on peeling strength).

TABLE 1

| Properties | FCCL of the current invention |
|---|---|
| Thickness | 20 μm (dielectric layer, can be customized)<br>80 μm (after copper cladding) |
| CTE | 3.47 ppm/K (after copper cladding) |
| Glass transition temperature ($T_g$) | — |
| Melting point ($T_m$) | — |
| UL flame rating | Testing in progress (target UL94-V0) |
| Dimension stability | <0.5% |
| Water absorption rate | 0.015% (after copper cladding) |
| Dielectric strength | DC: 11.25 kV/mm<br>AC: 9.5 kV/mm |
| Surface resistance | $1.39 \times 10^{14}$ Ω |
| Tensile strength | 180-190 MPa |
| Peeling strength | 10 N/cm |

Table 2 below shows the dielectric properties of the raw materials selected for the electrospinning of nanofibers in the present invention.

TABLE 2

| | 10 GHz | |
|---|---|---|
| | Dk | Df |
| PAN | 2.7 | 0.06 |
| PPO | 2.7 | 0.004 |

TABLE 2-continued

| | 10 GHz | |
|---|---|---|
| | Dk | Df |
| PTFE | 2.1 | 0.0001 |
| PEEK | 3.2 | 0.003 |
| PET | 3.2 | 0.003 |
| PI | 3.6 | 0.0018 |

Example 1—Study of Nanofiber Diameter, Porosity and Dk/Df Relationship

As shown below, when polyacetonitrile (PAN) is subjected to heat treatment of temperature 200° C.-300° C. under 1 atm, the nitrile groups will be cyclized, hence altering the physical properties of the polymer, including the pore size, porosity and dielectric properties.

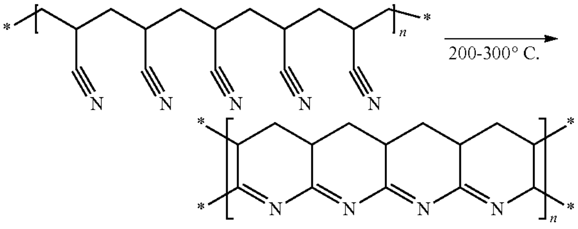

The average pore sizes of samples of polyacetonitrile with different average fiber diameters, before and after cyclization are studied, and the results are as below in Table 3:

TABLE 3

| | Average fiber diameter (nm) | Average pore size (nm) |
|---|---|---|
| PAN-1 | 300 | 1009 |
| PAN-2 | 400 | 1687 |
| PAN-3 | 500 | 2147 |
| cPAN-1 | 300 | 965 |
| cPAN-2 | 400 | 1711 |
| cPAN-3 | 500 | 2250 |

Furthermore, the dielectric properties of the cyclized PAN (cPAN) nanofibers are measured, see Table 4.

TABLE 4

| | Avg. pore size | Porosity | Dk (GHz) | | | | Df (GHz) | | | |
|---|---|---|---|---|---|---|---|---|---|---|
| | (nm) | (%) | 20 | 28 | 35 | 40 | 20 | 28 | 35 | 40 |
| cPAN-1 | 965 | 75.7187 | 1.2664895 | 1.2421155 | 1.2251135 | 1.2397305 | 0.0067685 | 0.006087 | 0.005164 | 0.009262 |
| cPAN-2 | 1711 | 85.0718 | 1.3745485 | 1.346646 | 1.4122165 | 1.3884785 | 0.010682 | 0.0068485 | 0.006588 | 0.0073405 |
| cPAN-2 | 2250 | 88.1663 | 1.39779 | 1.3885265 | 1.4585575 | 1.332368 | 0.0039795 | 0.0046865 | 0.0042925 | 0.0044685 |

Example 2—Measurement of Dk and Df Values of Nanofibers

The Dk and Df values of (i) the electrospun cPAN nanofibers only; (ii) adhesive only and (iii) electrospun cPAN nanofibers with adhesive laminated were measured over a range of high frequencies. Different nanofibers laminated with adhesive were also subjected to the same Dk and Df value measurements. The results are tabulated into Tables 5 to 9 below.

TABLE 5

(cPAN nanofiber sample only):

| 10 GHz | | 20 GHz | | 28 GHz | | 35 GHz | | 40 GHz | |
|---|---|---|---|---|---|---|---|---|---|
| Dk | Df | Dk | Df | Dk | Df | Dk | Df | Dk | Df |
| 1.2 | 0.003 | 1.3 | 0.004 | 1.2 | 0.003 | 1.3 | 0.004 | 1.2 | 0.004 |

TABLE 6

(PPO nanofiber sample only):

| 10 GHz | | 20 GHz | | 28 GHz | | 35 GHz | | 40 GHz | |
|---|---|---|---|---|---|---|---|---|---|
| Dk | Df | Dk | Df | Dk | Df | Dk | Df | Dk | Df |
| 1.4 | 0.002 | 1.3 | 0.002 | 1.4 | 0.002 | 1.5 | 0.001 | 1.4 | 0.002 |

TABLE 7

(PTFE nanofiber sample only):

| 10 GHz | | 20 GHz | | 28 GHz | | 35 GHz | | 40 GHz | |
|---|---|---|---|---|---|---|---|---|---|
| Dk | Df | Dk | Df | Dk | Df | Dk | Df | Dk | Df |
| — | — | — | — | 1.4 | 0.0004 | — | — | — | — |

TABLE 8

(Adhesive only):

| 10 GHz | | 20 GHz | | 28 GHz | | 35 GHz | | 40 GHz | |
|---|---|---|---|---|---|---|---|---|---|
| Dk | Df | Dk | Df | Dk | Df | Dk | Df | Dk | Df |
| 2.4 | 0.0004 | — | — | — | — | — | — | — | — |

TABLE 9

(Nanofiber samples laminated with adhesive):

| | 10 GHz | | 20 GHz | | 28 GHz | | 35 GHz | | 40 GHz | |
|---|---|---|---|---|---|---|---|---|---|---|
| | Dk | Df | Dk | Df | Dk | Df | Dk | Df | Dk | Df |
| PI | 3.5 | 0.02 | 3.7 | 0.02 | 3.6 | 0.03 | 3.6 | 0.02 | 3.6 | 0.02 |
| LCP | 3.2 | 0.002 | 3.3 | 0.002 | 3.3 | 0.002 | 3.3 | 0.002 | 3.3 | 0.002 |
| cPAN | 2.1 | 0.003 | 2.1 | 0.003 | 2.1 | 0.003 | 2.1 | 0.003 | 2.1 | 0.003 |
| PPO | 2.2 | 0.001 | 2.1 | 0.001 | 2.1 | 0.001 | 2.1 | 0.001 | 2.1 | 0.001 |
| PTFE | — | — | 2.0 | 0.0009 | 2.0 | 0.0009 | 2.0 | 0.0008 | 2.0 | 0.0008 |

Example 3—Antenna and Transmission Lines

Figure 1:
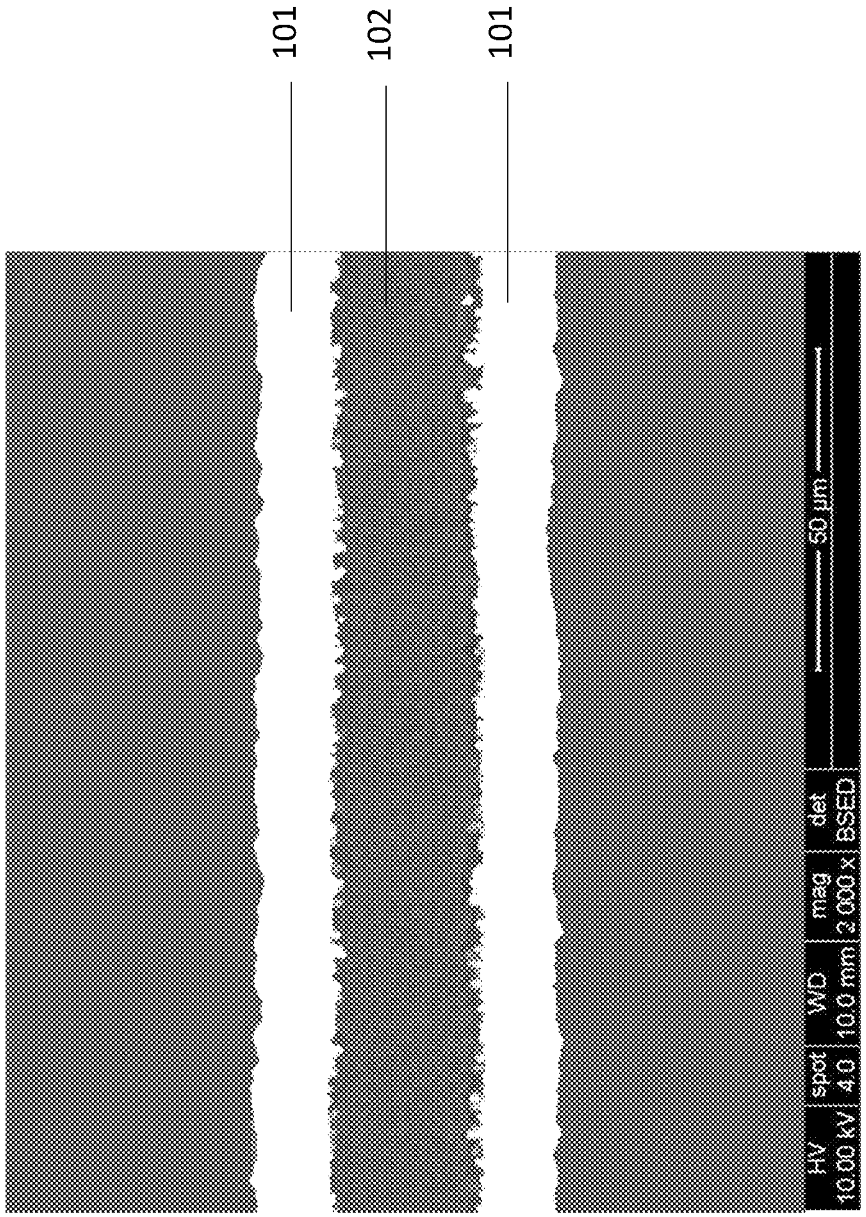
FIG. 1 is the SEM image of a structure of the flexible copper clad laminate in the present invention, where 101 represents copper layer and 102 represents the nanofiber network layer infused with adhesive. It should be noted that the nanofiber network layer infused with adhesive has a thickness of 30 μm-50 μm, providing various thickness options of materials for the design of different passive RF devices.
Figure 2:
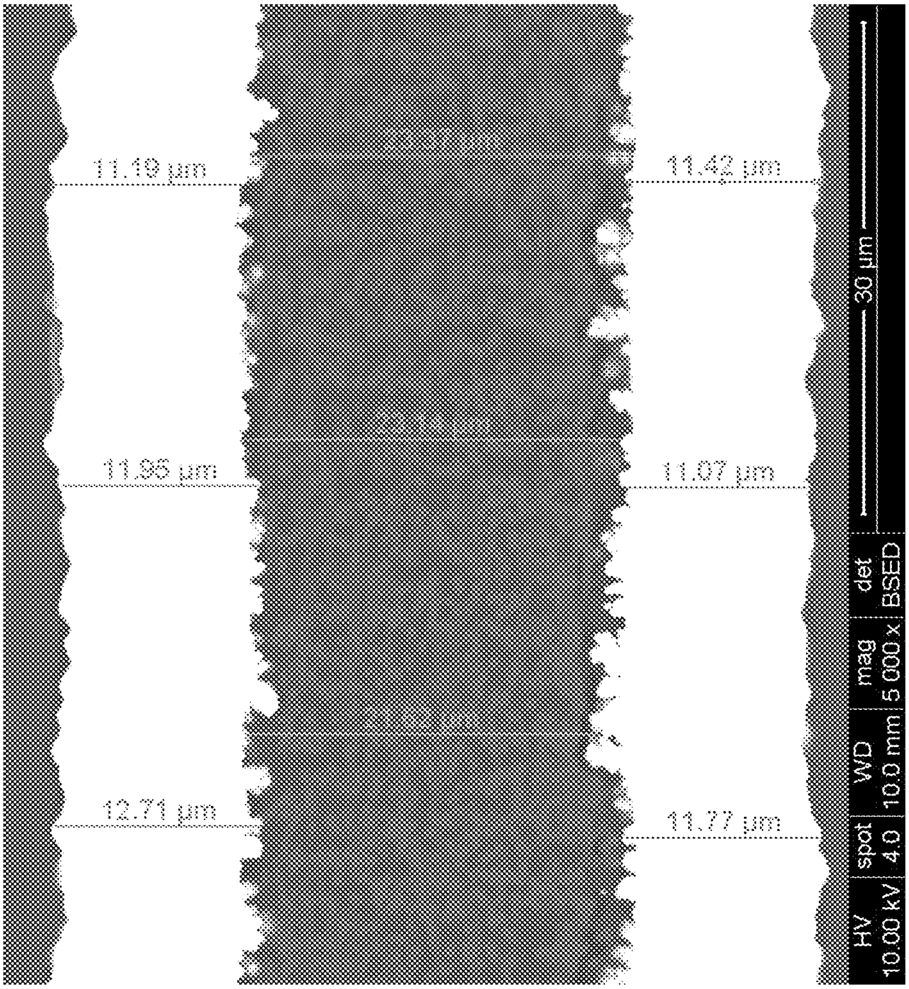
FIG. 2 is the SEM image of the cross-section of the flexible copper clad laminate in the present invention, which provides a clear illustration of its laminated structure.
Figure 3A:
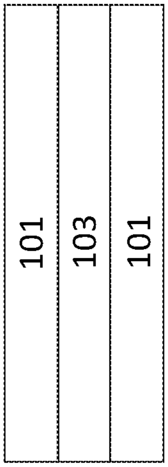
FIGS. 3A, 3B and 3C are schematic representations of the structures of the antenna adopted in Examples 1, 2 and 3 respectively. 101 represents copper layer, 102 represents nanofiber network layer infused with adhesive and 103 represents additional dielectric layer.

In this example, the dielectric substrate of the antenna is arranged in a tri-layered structure according to FIG. 3A, where an adhesive-infused cPAN nanofiber network layer is cladded with copper on both the upper and lower surfaces to form a flexible copper clad laminate (FCCL).

The antenna is structured in a 2×2 microstrip antenna array configuration. The upper copper layer is used for etching the antenna pattern, while the lower copper layer serves as the reflective surface of the antenna, and is grounded. The transmission line which connects the antenna to other modules or ICs in the system is a ground coplanar waveguide (GCPW), which provides better shielding effect for signal transmission to ensure the quality of signal transmission.

Figure 4A:
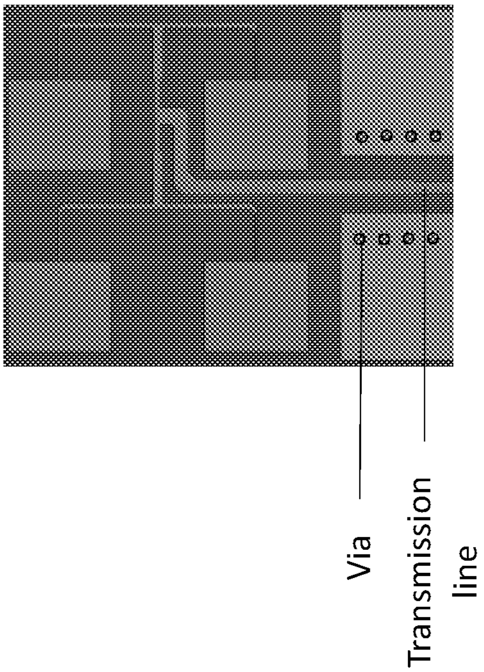
FIGS. 4A and 4B illustrate the overall setup of the antenna corresponding to Example 1 below.
Figure 4B:
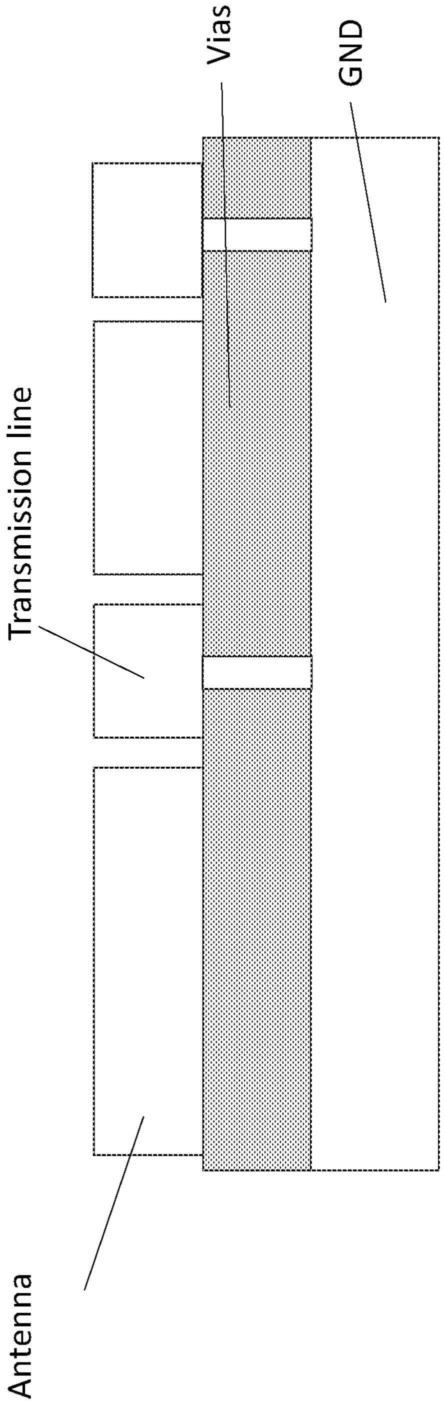
Figure 5A:
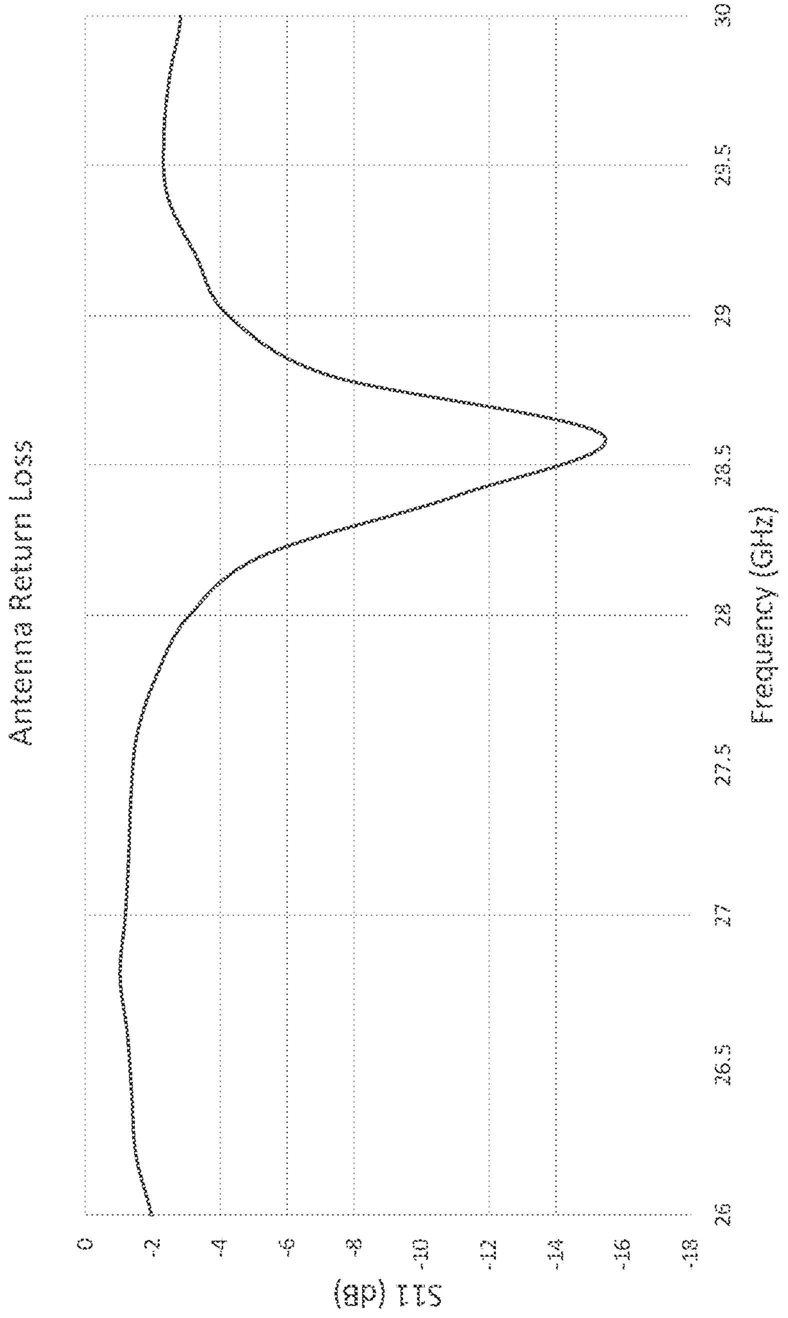
FIG. 5A shows the return loss of the antenna within the frequency band of 26 GHz to 30 GHz.
Figure 5B:
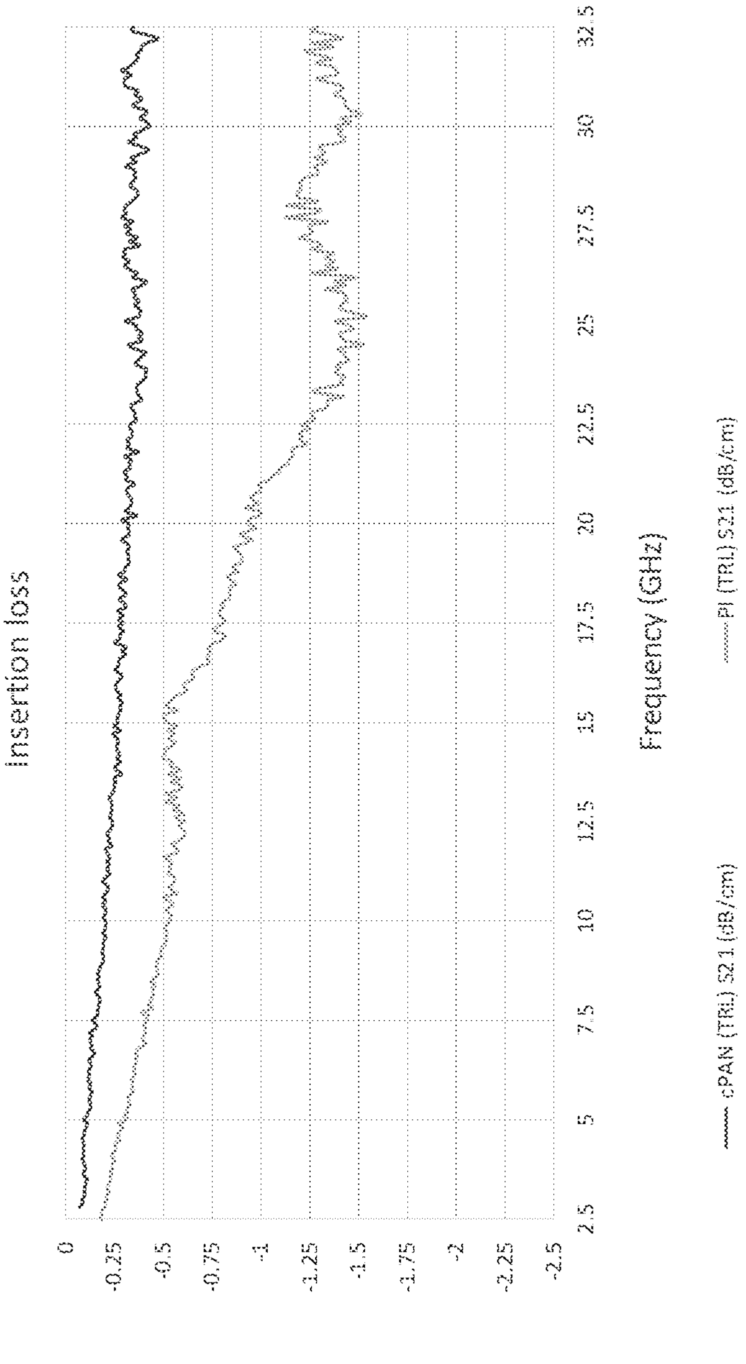
FIG. 5B shows a comparison of the insertion loss of the transmission line from IC to antenna of a traditional flexible printed circuit board (FPCB) and the antenna of the present invention.

The antennae with the above FCCL and transmission lines are designed according to FIGS. 4A and 4B. Subsequently, the return loss of the antenna and the insertion loss of transmission line for signal transmission are measured, as illustrated in FIGS. 5A and 5B respectively. The insertion loss of transmission line of an FPCB with PI used as the traditional dielectric material is also plotted in FIG. 5B as a comparison. The insertion loss of transmission line of the antenna with FCCL of the present invention is lower than the traditional transmission line at millimeter wave band.

Table 10 below shows the insertion loss of the FCCL of the present invention and that of the traditional transmission line with PI as the dielectric material. It can be observed that the insertion loss of transmission line of the antenna with FCCL of the present invention is lower than the traditional transmission line at millimeter wave band.

TABLE 10

| | Insertion Loss (dB/cm) | | | | |
|---|---|---|---|---|---|
| | 5 GHz | 10 GHz | 28 GHz | 30 GHz | 75 GHz |
| PI | −0.3 | −0.53 | −1.1 | −1.4 | −3.3 |
| FCCL of the present invention | −0.09 | −0.2 | −0.31 | −0.43 | −0.34 |

From FIG. 4A, the resonant frequency band is observed, and the peak gain of the antenna is also measured accordingly, see Table 11 below.

TABLE 11

| Resonant frequency band (GHz) | Peak Gain (dBi) |
|---|---|
| 28.4-28.7 | 4.2 (measured at 28.5 GHz) |

Figure 6:
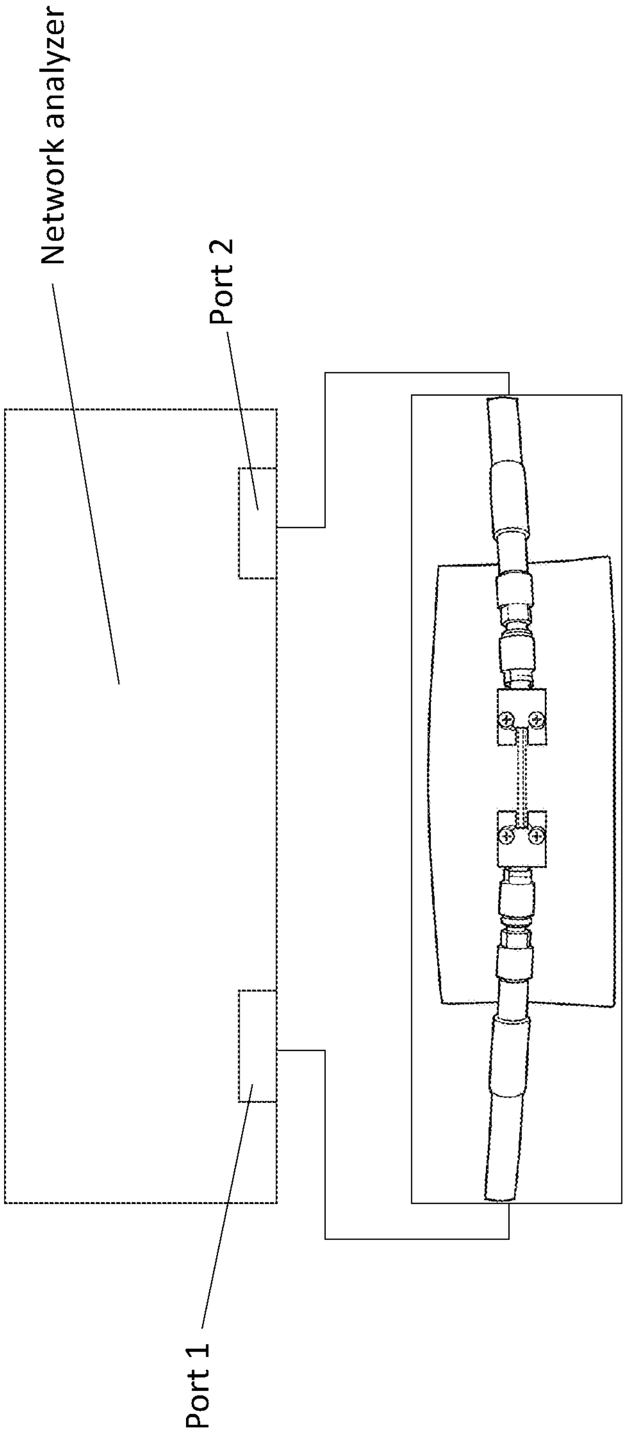
FIG. 6 illustrates the setting for testing signal delays of FPCB and the antenna of the present invention. The length of the transmission line for both the antenna with FCCL of the present invention and a traditional FPCB with PI are fixed at 18.4 mm.

A further signal delay measurement is carried out with the transmission lines of the antenna with cPAN of the present invention and a transmission line with PI. The signal delay test setup is illustrated in FIG. 6 (the lengths of the transmission lines are 18.4 mm), and the measured time delays based on the network analyzer are shown in Table 12.

TABLE 12

| Frequency (GHz) | Time delay - cPAN (ps) | Time delay - PI (ps) | Delay percentage |
|---|---|---|---|
| 1 | 276.88 | 281.94 | −1.8% |
| 5 | 271.43 | 283.3 | −4.2% |
| 28 | 249.63 | 312.98 | −20.2% |
| 40 | 275.98 | 373.24 | −26.1% |

With reference to Table 5, the dielectric constant (Dk) of cPAN and PI are 2.1 and approximately 3.6 respectively, which may affect transmission delay. From the data below, it could be observed that, cPAN has a generally lower time delay in signal transmission, hence supporting that the FCCL of the current invention which utilizes cPAN is more favorable over traditional FPCBs in high-speed high-frequency transmission.

Example 4

Figure 3B:
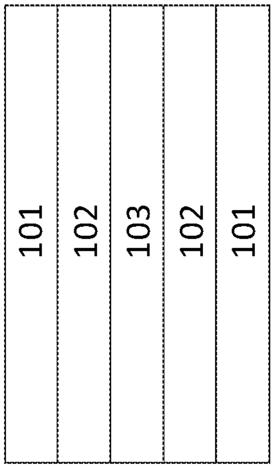
Figure 3C:
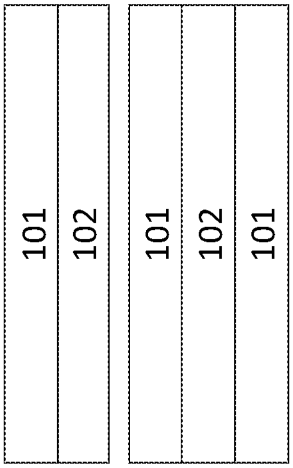

In accordance with another embodiment of the present invention, the dielectric substrate is arranged in a five-layered structure as illustrated in FIG. 3B, where an additional dielectric layer is inserted in between the nanofiber network layers.

Figure 7A:
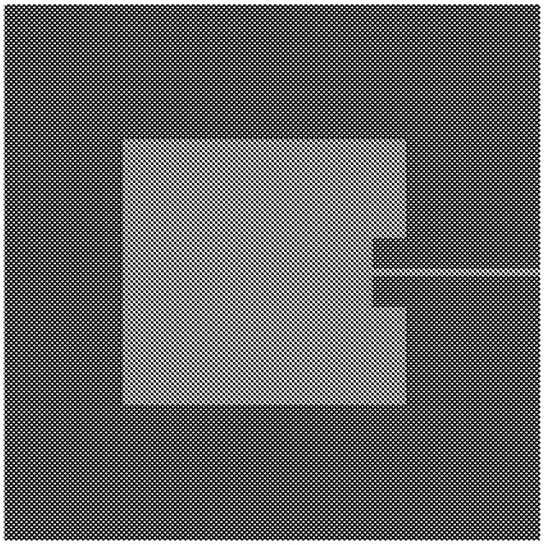
FIGS. 7A and 7B illustrate the overall setup of the antenna corresponding to Example 2 below.
Figure 7B:
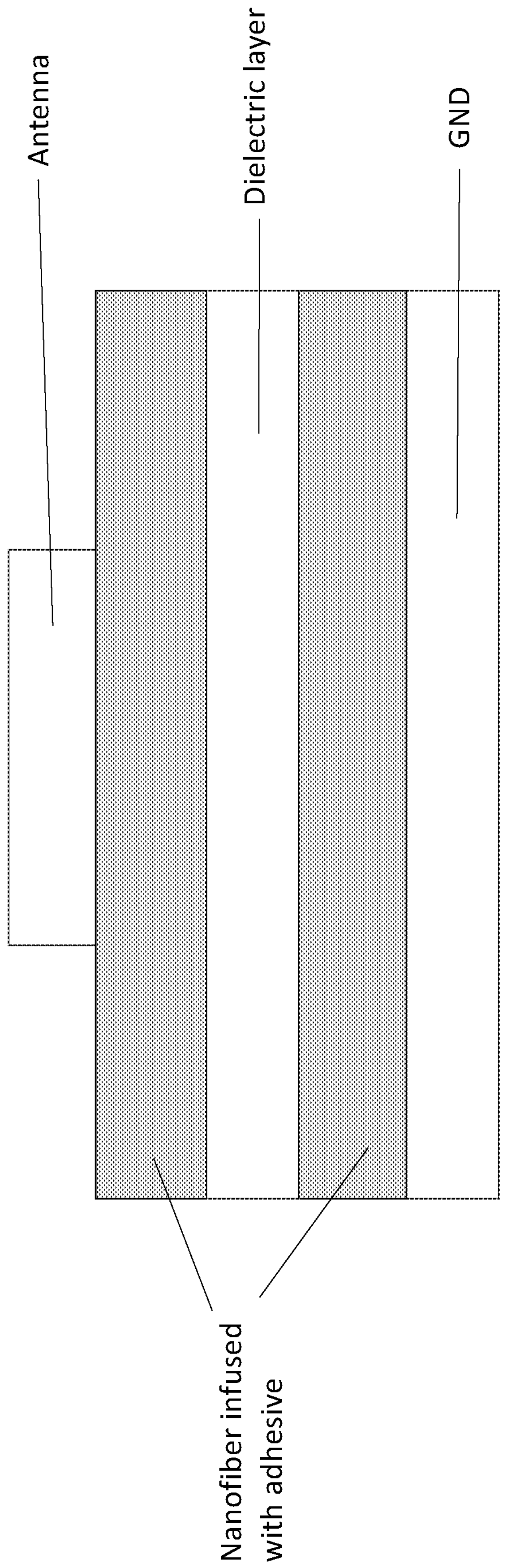

The antenna adopts the structure as shown in FIGS. 7A and 7B. The antennae is a microstrip, with the upper copper layer used for etching the antenna pattern, and the lower copper layer serving as the reflective surface of the antenna, and is grounded.

Antennae of the same structure and different thicknesses were subjected to return loss and peak gain measurements, with each antenna formed with the dielectric substrate structure described in Para. above but with dielectric layers of different thicknesses. The measured results of the return losses and peak gains of the antennae are illustrated in FIGS. 8A and 8B.

Figure 8A:
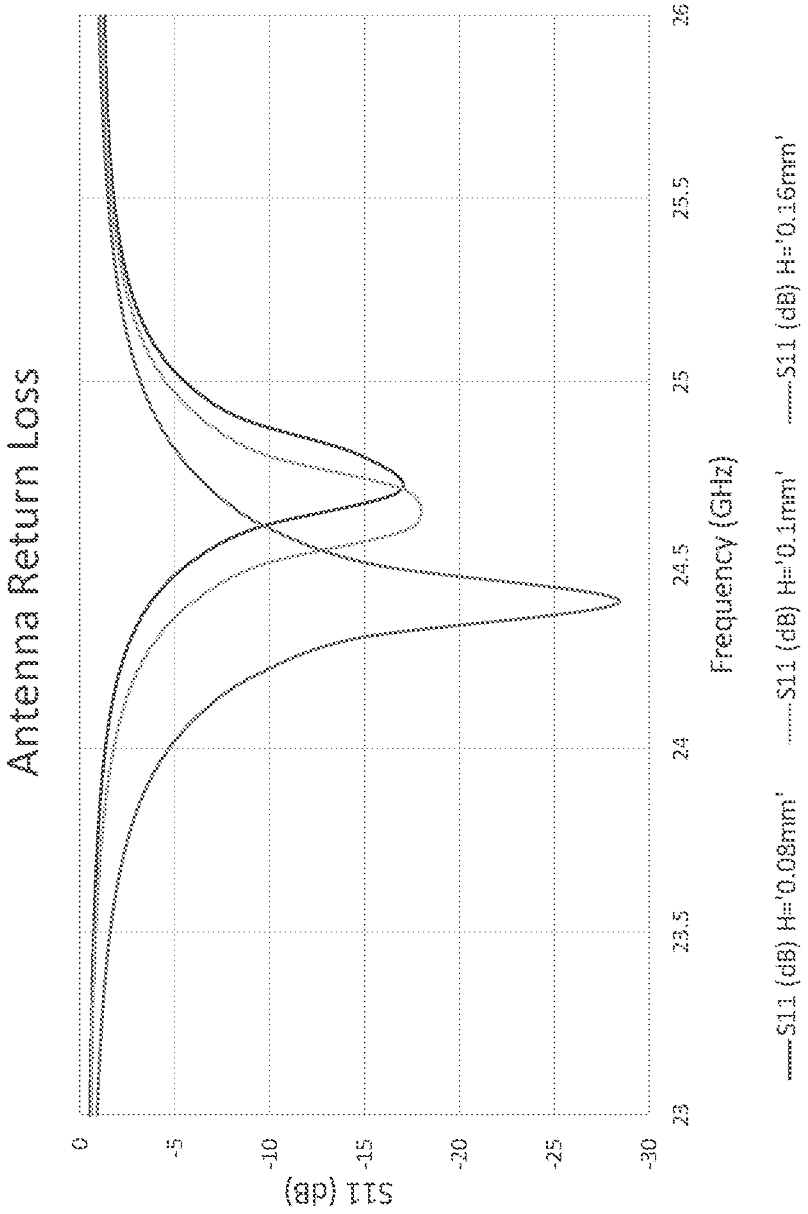
FIG. 8A shows the return loss of the antenna within the frequency ban of 23 GHz to 26 GHz.

From FIG. 8A, it is observed that the resonant frequencies of the antennae were found within the range of 24 GHz to 25 GHz.

Figure 8B:
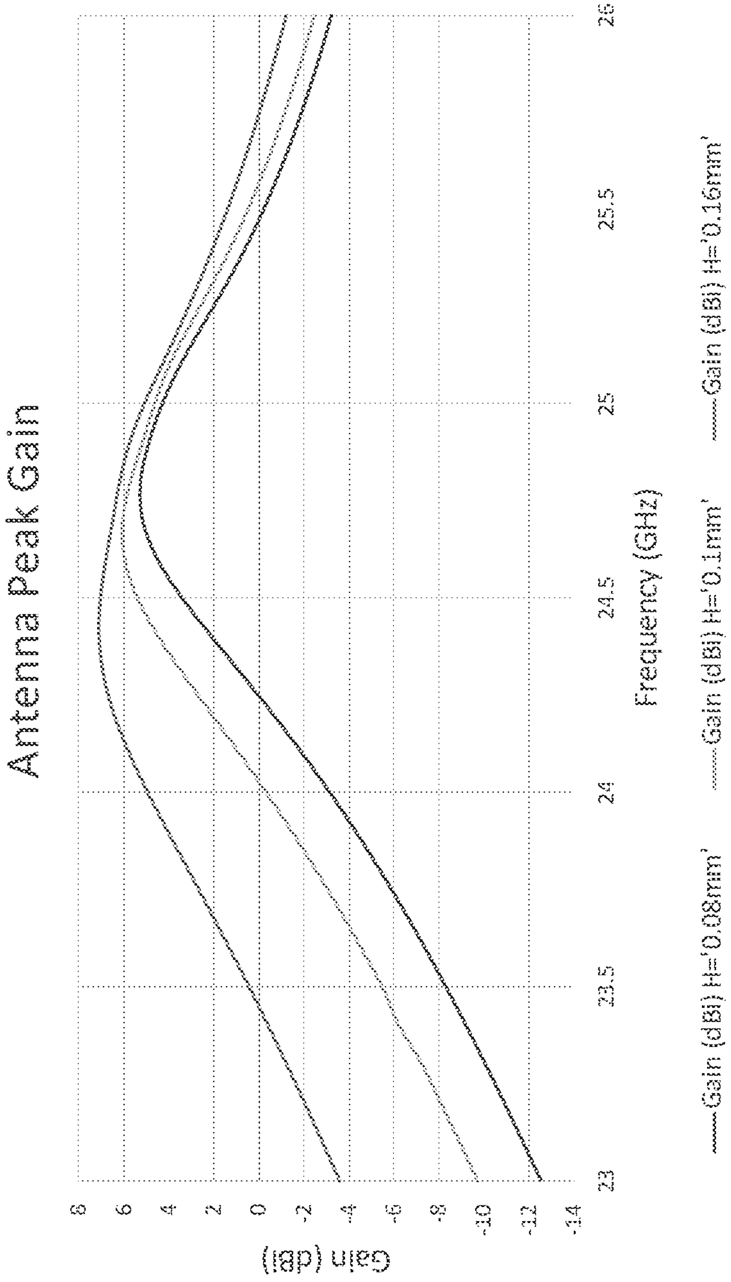
FIG. 8B show the comparison of peak gains of the antenna against frequency. Both

From FIGS. 8A and 8B, it is observed that an increased total thickness of dielectric layer generally improves both the return loss and gain of the antenna. It is suggested that low-cost dielectric materials, such as PI, could be used to increase the total thickness of the dielectric layer without causing a significant increase in the loss of dielectric material, and thus improve antenna gain.

Example 5

Figure 9A:
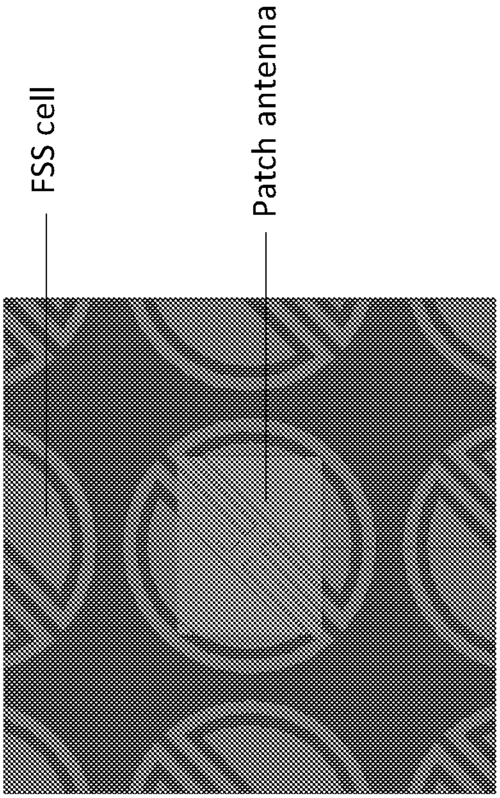
FIGS. 9A and 9B illustrate the overall setup of the antenna corresponding to Example 3 below.
Figure 9B:
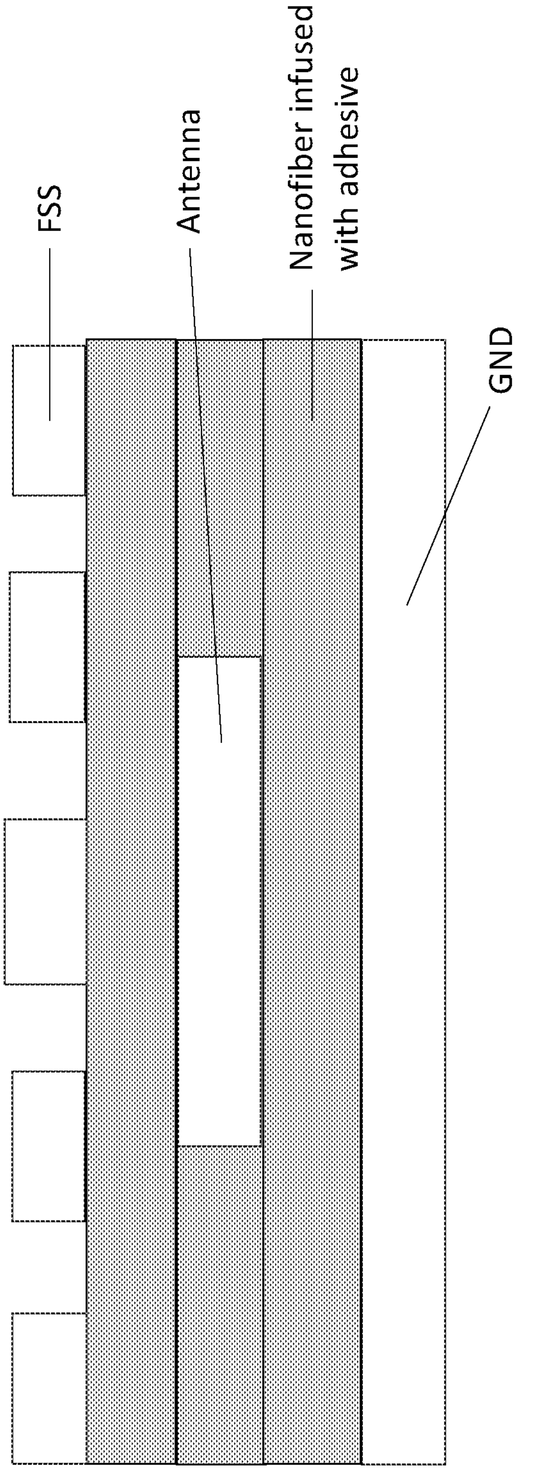

In accordance with another embodiment of the present invention, a multi-layered structure of a microstrip antenna integrated with frequency-selective surface (FSS) cells is adopted, as illustrated in FIGS. 9A and 9B.

The unitary structure of the FSS is composed of 2 semicircular open rings and a semicircular metal patch placed inside the semicircular open rings. The resonant frequency of the antenna can be tuned by adjusting the lengths of the semicircular arms. The FSS is printed on a low-loss material nanofiber structure to further reduce bot the dielectric constant and dielectric loss. The above frequency-selective surface is placed on the microstrip antenna to form a multi-layer integrated FSS-antenna structure. The lens function of the FSS can improve antenna gain to achieve a millimeter wave antenna with high performance with light and thin structure.

The above multi-layered microstrip antenna with FSS is subjected to antenna gain measurements. A microstrip antenna with the same structure but without the FSS cells is used as a control. The results are shown in Table 13 below.

TABLE 13

| | Without FSS | With FSS | Percentage increase |
|---|---|---|---|
| Antenna Peak Gain at 28 GHz | 5.9 dBi | 7.4 dBi | 25% |

It is observed that the gain of patch antenna is improved at 28 GHz by using FSS.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

Definitions

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they allow for elements not explicitly recited, but exclude elements that are found in the prior art or that affect a basic or novel characteristic of the present invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Other definitions for selected terms used herein may be found within the detailed description of the present invention and apply throughout. Unless otherwise defined, all other technical terms used herein have the same meaning as commonly understood to one of ordinary skill in the art to which the present invention belongs.

It will be appreciated by those skilled in the art, in view of these teachings, that alternative embodiments may be implemented without undue experimentation or deviation from the spirit or scope of the invention, as set forth in the appended claims. This invention is to be limited only by the following claims, which include all such embodiments and modifications when viewed in conjunction with the above specification and accompanying drawings.

The invention claimed is:

1. A low loss flexible copper clad laminate (FCCL) for millimeter wave transmission, comprising at least one dielectric sheet layer and at least one conductor layer, wherein:

the dielectric layer is a nanofiber network, wherein the nanofiber is formed by electrospinning of a first resin;

the nanofiber network comprises micropores or nanopores, wherein the micropores or nanopores are through pores or blind pores;

the nanofiber network is infused with a second resin; and wherein the conductor layer is copper;

wherein the first resin is selected from cyclized polyacrylonitrile, polyphenylene ether, m-polyimide, polytetrafluoroethylene, polyetheretherketone or polyterephthalate;

wherein the low loss flexible copper clad laminate has a Dk value of lower than 2.5 and Df value of lower than 0.005 during millimeter wave transmission;

wherein a difference in dielectric constants between the first resin and the second resin is less than 1.0; and wherein a transmission line mismatch loss due to fiber weave effect is less than 1%.

2. The low loss flexible copper clad laminate according to claim 1, wherein the second resin is selected from polyethylene, polyether ether ketone, polyethylene naphthalate, polyethylene terephthalate or polyimide.

3. The low loss flexible copper clad laminate according to claim 1, wherein the dielectric losses of the first resin and second resin is less than 0.005.

4. The low loss flexible copper clad laminate according to claim 1, wherein a diameter of the nanofiber in the dielectric layer is 300 nm to 500 nm.

5. The low loss flexible copper clad laminate according to claim 1, wherein a size of the micropores or nanopores in the nanofiber network is 900 nm to 2.5 μm.

6. The low loss flexible copper clad laminate according to claim 1, wherein a porosity of the nanofiber network in the dielectric layer is 75% to 90%.

7. The low loss flexible copper clad laminate according to claim 1, wherein the laminate has a coefficient of thermal expansion of lower than 3.6 ppm/K.

8. A high frequency transmission device for transmission of high frequency signal, comprising the low loss flexible copper clad laminate of claim 1.

9. The high frequency transmission device of claim 8, wherein the device is a passive RF device selected from antenna or transmission lines.

10. The high frequency transmission device of claim 8, wherein:

a diameter of the nanofiber in the dielectric layer of the low loss flexible copper clad laminate is 300 nm to 500 nm;

a size of the micropores or nanopores in the nanofiber network of the low loss flexible copper clad laminate is 900 nm to 2.5 μm;

a porosity of the nanofiber network in the dielectric layer of the low loss flexible copper clad laminate is 75% to 90%; the nanofiber network in the dielectric layer of the low loss flexible copper clad laminate is infused with a second resin selected from polyethylene, polyether ether ketone, polyethylene naphthalate, polyethylene terephthalate or polyimide;

the dielectric loss of the first resin and second resin in the low loss flexible copper clad laminate is less than 0.005.

* * * * *